United States Patent [19]
Banu

[11] Patent Number: 4,518,870
[45] Date of Patent: May 21, 1985

[54] COMMON MODE SIGNAL DETECTOR

[75] Inventor: Mihai Banu, Woodside, N.Y.

[73] Assignee: AT&T Bell Laboratories, Murray Hill, N.J.

[21] Appl. No.: 539,619

[22] Filed: Oct. 6, 1983

[51] Int. Cl.³ .............................................. H03F 3/45
[52] U.S. Cl. .................................. 307/356; 330/253; 330/258
[58] Field of Search ...................... 330/257, 258, 253; 307/355, 356

[56] References Cited

U.S. PATENT DOCUMENTS 4,430,621  2/1984  Wieser et al. ...................... 330/253

OTHER PUBLICATIONS

Cordaro, "Complementary FET Differential Amplifier", *IBM Technical Disclosure Bulletin*, vol. 16, No. 10, Mar. 1974, pp. 3227, 3228.
"MOS Operational Amplifier Design—A Tutorial Overview," *IEEE Journal of Solid-State Circuits*, vol. SC-17, P. R. Gray and R. G. Meyer, pp. 969-982, Dec. 1982.

*Primary Examiner*—James B. Mullins
*Attorney, Agent, or Firm*—David I. Caplan

[57] ABSTRACT

A common mode detector (10) for producing an output voltage (VA+VB)/2 in response to input voltages VA and VB contains a pair of MOS transistors (MA and MB) connected in series between a pair of input terminals A and B to which the input voltages (VA and VB) are to be applied. A separate feedback path runs from each input terminal (A, B) through a separate load device (LA2, LB2) to a gate control terminal of the respective MOS transistor (MA, MB), and a separate other feedback path runs from each input terminal (A, B) through a separate other load device (LA3, LB3) to a substrate terminal (SA, SB) of the respective MOS transistors. In this way, the respective feedback paths deliver to the respective gate terminals respective voltages equal to (VDD+VA)/2 and (VDD+VB)/2, respectively, while the other feedback paths deliver to the substrates of the respective MOS transistors (MA, MB) respective substrate bias voltages equal to (VSS+VA)/2 and (VSS+VB)/2, whereby the common mode voltage (VA+VB)/2 is developed at a node (AB) between the pair of MOS transistors (MA, MB).

10 Claims, 2 Drawing Figures

COMMON MODE SIGNAL DETECTOR

FIELD OF THE INVENTION

This invention relates to semiconductor transistor circuits and more particularly to MOS (metal oxide semiconductor) circuits for detecting the common mode component of two signals.

BACKGROUND OF THE INVENTION

In a variety of semiconductor MOS circuit applications, particularly in the field of analog signal processing, it is desired to detect and develop the common mode signal component (VA+VB)/2 of two voltage signals VA and VB, and to utilize this common mode signal, for example, as a feedback signal. For example, in the design of a differential (difference) operational amplifier to which a pair of input signals is applied, it is often desired that the amplifier be balanced, that is, the amplifier should produce a pair of output signals V1 and V2 that are balanced—i.e., the sum of the outputs (V1+V2) in response to the pair of input signals should be fixed, so that the common mode output signal component (V1+V2)/2 is independent of input signals, while the difference mode output signal component (V1−V2) should be proportional, by a gain factor G, to the difference in the input signals. Accordingly, in a thus balanced amplifier, if one of the input signals increases by an increment δ while the other remains constant, then one of the outputs, say V1, increased by an amount of Gδ while the other of the output V2 decreases by Gδ; thus the difference in these outputs (V1−V2) increases by 2Gδ, while the sum of these outputs (V1+V2) remains constant. In other words, in a balanced amplifier there is no change in the common mode output component (V1+V2)/2, and the common mode signal component is said to be "rejected" by the amplifier.

One way of balancing an amplifier is to detect the common mode output signal component of the amplifier and then to cancel or remove from the outputs of the amplifier any increments in the common mode component thereof by means of negative feedback of the common mode, as taught, for example, in the paper by P. R. Gray and R. G. Meyer entitled "MOS Operational Amplifier Design—A Tutorial Overview", published in *IEEE Journal of Solid-State Circuits,* Vol. SC-17, pp. 969-982, at page 979 (1982). Thus a common mode detector is useful for achieving a balanced amplifier.

As described in the aforementioned paper by P. R. Gray and R. G. Meyer, a straightforward technique for building a common mode detector is to connect one terminal of each of a matched pair of (identical) resistors R1 and R2 to a common terminal, apply the voltage V1 at the other terminal of R1 and the voltage V2 at the other terminal of R2, and detect the voltage developed at the common terminal. In semiconductor integrated circuit technology, such a technique, however, suffers from a requirement of rather large values for the resistances of the matched pair in order not to dissipate undue amounts of power, and if such large resistances would be supplied by ordinary polycrystalline silicon strips they would occupy undue amounts of precision semiconductor area. Moreover, turning to common mode detection techniques using MOS transistors, design of an accurate common mode detector has heretofore presented difficult MOS circuit design problems which have not yet been satisfactorily solved. See, for example, the aforementioned paper by P. R. Gray and R. G. Meyer. The difficulty in design stems from the strongly nonlinear individual device characteristics of MOS transistor, which make it difficult to maintain the resistances of a pair of such transistors as precisely equal as desired for accurate common mode detection. Accordingly it would be desirable to have an MOS circuit capable of accurate detection of common mode signal, that is, a circuit which produces the common mode output voltage component (VA+VB)/2 of voltages VA and VB.

SUMMARY OF THE INVENTION

This invention is for a common mode detector, for supplying an output signal (VA+VB)2 representative of the common mode component of first and second input signal voltages VA and VB, having first and second transistors connected in series between first and second input terminals, respectively, of the detector to which the first and second input signal voltages, respectively, are to be applied, the transistors being separately provided with respective feedback paths running from each respective input terminal through a respective load device to the respective gate control terminal of the respective transistor, whereby respective feedback path delivers to each of respective gate control terminal a respective voltage equal to one-half the sum of a first reference voltage and the respective input signal voltage, and the transistors further being provided with a separate respective other feedback path running from each respective input terminal to the respective substrate bias control terminal of the respective transistor, whereby in response to the input signals each respective other feedback path delivers a respective voltage equal to one-half the sum of a second reference voltage and the respective input signal voltage. Advantageously each feedback path includes a load device which is connected in series with another, substantially identical load device which is connected to a respective reference voltage terminal to which the respective reference voltage is to be applied.

In a specific embodiment of the invention, the first and second transistors are matched (substantially identical) N-channel MOS field effect transistors, and the load devices in the feedback paths are all N-channel MOS load transistors each of which is located in a separate p-type conductivity bulk region ("p-tub"). Advantageously, the source terminal of each load transistor is separately connected to the substrate terminal thereof, and the drain terminal of each is separately connected to the gate terminal thereof. In this way, the common mode component (VA+VB)/2 is delivered at a node between the first and second transistors independently of the individual transistor device characteristics.

DETAILED DESCRIPTION

Figure 1:
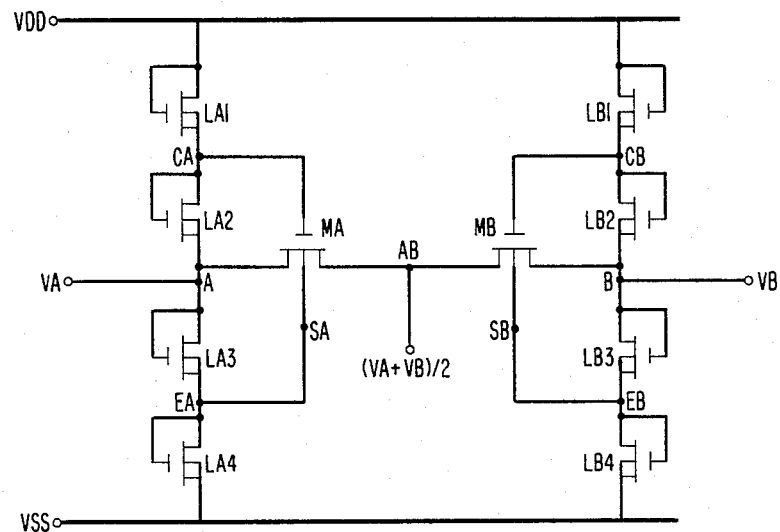
FIG. 1 shows a schematic circuit diagram of a common mode detector, in accordance with a specific embodiment of the invention.

As shown in FIG. 1, a common mode detector 10 has input terminals A and B, to which input voltages VA and VB are applied, and an output terminal AB at which the common mode output voltage $(VA+VB)/2$ is developed, as more fully explained below. One of the input terminals A is connected to one of the high current carrying terminals (source or drain) of MOS transistor MA, and the other high current carrying terminal of MA is connected to the output terminal AB of the detector 10. The output terminal AB is connected to one of the high current carrying terminals of MOS transistor MB, and the other high current carrying terminal of MB is connected to the other input terminal B. Advantageously, MOS transistors MA and MB are identical N-channel transistors, enhancement or depletion type. The input terminal A is separately connected through substantially identical, serially connected load devices LA2 and LA1 to a VDD line—i.e., to a line to which a steady voltage VDD is applied, typically about +5 volts. Similarly, the input terminal B is connected in series through substantially identical, serially connected load devices LB2 and LB1 to this VDD line. A node CA between the load devices LA1 and LA2 is connected to the gate electrode of the transistor MA, and a node CB between the load devices LB1 and LB2 is connected to the gate electrode of the transistor MB.

The input terminal A is also separately connected through substantially identical, serially connected load devices LA3 and LA4 to a VSS line—i.e., a line to which at a voltage VSS is applied, typically about −5 volts. Similarly, the input terminal B is also separately connected through substantially identical, serially connected load devices LB3 and LB4 to this VSS line. A node EA between the load devices LA3 and LA4 is connected to a substrate terminal SA of the transistor MA, whereby the substrate bias voltage of the transistor MA is maintained at the voltage of this node EA between LA3 and LA4; and a node EB between the load devices LB3 and LB4 is connected to a substrate terminal SB of the transistor MB, whereby the substrate bias voltage of this transistor MB is maintained at the voltage of this node EB between LB3 and LB4.

Each of the load devices La1 . . . LA4, LB1 . . . LB4 advantageously is a separate N-channel, preferably depletion type, transistor whose gate electrode is connected to its drain terminal, and whose substrate bias terminal is connected to its source terminal (back-gate bias voltage of zero). Advantageously, the loads LA1 and LA2 are matched (substantially identical), as are the loads LA3 and LA4, LB1 and LB2, and LB3 and LB4.

During operation, the voltage VCA which is developed at node CA between load devices LA1 and LA2 is midway between VDD and VA, i.e., $VCA=(VDD+VA)/2$—because both of these loads carry the same current and thus must have the same voltage drops owing to their identical (matched) voltage versus current characteristics. Similarly, the voltage VEA is midway between the voltages VSS and VA, i.e., $(VSS+VA)/2$; the voltage VCB at node CB is midway between VDD and VB, i.e., $(VDD+VBB)/2$; and the voltage VEB at node ED is midway between VB and VSS, i.e. $(VSS+VB)/2$. Accordingly, the gate-to-substrate voltage difference in MA, equal to $(VCA-VEA)$, is also equal to $(VDD-VSS)/2$. Likewise, the gate-to-substrate voltage difference in MB is likewise also equal to $(VDD-VSS)/2$. Since transistors MA and MB are (structurally) substantially identical since the current through each of these transistors is the same, there is a self-consistent circuit solution if and only if the source-to-drain voltage drops across each of these transistors are the same. Accordingly, the voltage at terminal AB is midway between VA and VB, i.e., the desired common mode voltage $(VA+VB)/2$. Note also that with this voltage at node AB, the voltage drop from the gate of MA to terminal A, equal to $(VDD+VA)/2 - VA = (VDD-VA)/2$, is the same as the drop from the gate of MB to terminal AB, equal to $(VDD+VB)/2-(VA+VB)/2=(VDD-VA)/2$; and the voltage drop from the gate of MA to terminal AB, is equal to $(VDD+VA)/2-(VA+VB)/2=(VDD-VB)/2$, is the same as the drop from the gate of MB to terminal B, equal to $(VDD+VB)/2-VB=(VDD-VB)/2$. In this way all corresponding voltage drops across the two matched transistors MA and MB are the same, as is required for equal currents through identical transistors.

Figure 2:
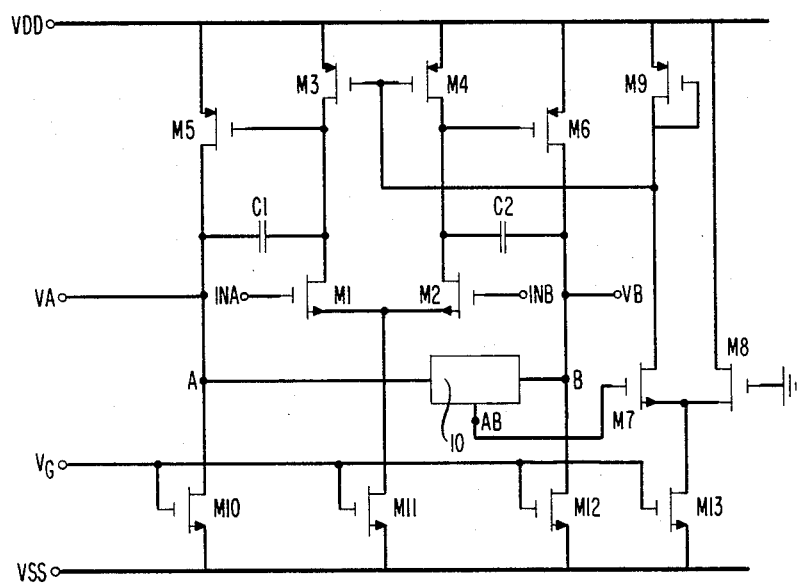
FIG. 2 shows a schematic circuit diagram of a differential operational amplifier, in accordance with another specific embodiment of the invention.

FIG. 2 shows a differential operational amplifier circuit arrangement 20 having balanced outputs at its output terminals VA and VB in response to input signals applied at its input terminals INA and INB. The circuit 20 basically comprises N-channel enhancement MOS input transistors M1, M2, M7, and M8, as well as P-channel depletion MOS load transistors M3, M4, M5, M6, and M9, together with N-channel depletion MOS current-source transistors M10, M11, M12, and M13. The current-source transistors M10, M11, M12, and M13 all have their source terminals connected to the VSS terminal, typically −5 volts, and their gate terminals connected to a suitable bias terminal VG, typically maintained at −4 volts. The load transistors M3, M4, M5, M6, and M9 all have their source terminals connected to the VDD terminal, typically 5 volts.

The input terminals INA and INB are connected to the gate terminals of drivers M1 and M2, respectively. The source terminals of these drivers M1 and M2 are both connected to the drain terminal of the current-source M11. The drain terminals of M1 and M2 are separately connected to the drain terminals of the loads M3 and M4, respectively, as well as to the gate terminals of the loads M5 and M6, respectively. The drain terminals of the current-sources M10 and M12 are separately connected to the drain terminals of the loads M5 and M6, respectively, and to the output terminals VA and VB, respectively. These output terminals VA and VB are separately connected to the input terminals A and B, respectively, of a common mode signal detector 10 of the kind discussed above in conjunction with FIG. 1. The output terminals VA and VB are also separately connected through capacitors C1 and C2, respectively, to the drain terminals of the drivers M1 and M2, respectively, for the purpose of operational amplifier compensation for stability against feedback oscillation, as known in the art. Note that in FIG. 2 the output terminal VA and VB of the circuit 20 carry the same voltages VA and VB as the input terminals A and B, respectively, of the common mode detector 10, similarly as in FIG. 1.

The signal detector 10 in FIG. 2 has an output terminal AB connected to the gate electrode of the driver M7. The source terminals of both this driver M7 and the driver M8 are connected to the drain terminal of the current-source transistor M13. The gate electrode of M8 is connected to ground, and its drain terminal is connected to VDD. The drain terminal of the driver M7 is connected to gate and drain terminal of the load M9. The drain of M7 is also connected to the gate terminals, both of load M3 and of load M4, to supply negative common mode feedback as more fully explained below.

During operation, the driver M1 and M2 together with the loads M3 and M4 and the current-source M11 form a first stage of the amplifier 20, the outputs of this first stage being delivered to the gate terminals of loads M5 and M6. In turn, these loads M5 and M6 together with current-sources M10 and M12 form a second stage of the amplifier 20, with the outputs thereof being developed at input terminals A and B of the common mode signal detector 10. The common mode signal (VA+VB)/2 is developed at the output terminal AB of the common mode detector 10 and is delivered to the gate terminal of the driver M7. This driver M7 in conjunction with the load M9 inverts this common mode signal and delivers the thus inverted common mode signal to the gate loads of M3 and M4. For example, a positive-going common mode output signal at VA and VB, by virtue of this feedback, causes the voltage at the gate terminals of both loads M3 and M4 to go negative, whereby the impedance of these P-channel loads M3 and M4 are both reduced and the voltages of the gate terminals of both M5 and M6 are both increased (toward VDD); accordingly the impedances of both M5 and M6 are both increased, whereby the voltages at output terminals VA and VB are both decreased (negative-going)—i.e., the originally positive-going common mode signal is cancelled by this negative feedback, as is desired for a balanced amplifier.

Although the invention has been described in detail with respect to specific embodiments, various modifications can be made without departing from the scope of the invention. For example, instead of N-channel MOS transistors in the circuit 10, P-channel MOS transistors can be used.

What is claimed is:

1. A common mode detector, for supplying an output signal representative of the common mode component of first and second input signals, comprising:
   (a) first and second devices whose high current paths are connected in series between first and second input terminals of the detector to which the first and second input signals are to be applied, each device having first and second high current carrying terminals and first and second control terminals;
   (b) first and second feedback paths running from the first and second input terminals, respectively, to a respective first control terminal of the first and second devices, respectively, whereby in response to the first and second input signals applied to the first and second input terminals, respectively, the first and second feedback paths deliver to the control terminals of the first and second devices, respectively, first and second feedback voltages each respectively being midway between a first reference voltage and the respective voltage of the first and second input signals, respectively;
   (c) third and fourth feedback paths running from the first and second input terminals, respectively, to a respective second control terminal of the first and second devices, respectively, whereby in response to the input signals the third and fourth feedback paths deliver to the second control terminals of the first and second devices, respectively, third and fourth feedback voltages each respectively being midway between a second reference voltage, different from the first, and the respective voltage of the first and second input signals, respectively.

2. The detector of claim 1 in which the first and second feedback paths each includes a separate load device which is separately connected in series with another load device, respectively, to a first reference voltage terminal to which the first reference voltage is to be applied.

3. The detector of claim 2 in which the third and fourth feedback paths each includes yet another separate load device which is separately connected in series with still another load device to a second reference voltage terminal to which the second reference voltage is to be applied.

4. The detector of claim 3 in which the first and second devices are matched MOS transistors, the gate electrode of each being the first control terminal and the substrate terminal of each being the second control terminal.

5. The detector of claim 4 in which every load device is a separate MOS transistor whose drain terminal is connected to its gate terminal and whose source terminal is connected to its substrate terminal, and which is substantially identical to the load device with which it is connected in series.

6. The detector of claim 1 in which the third and fourth feedback path each includes a separate load device which is separately connected in series with another load device to a reference voltage terminal to which the second reference voltage is to be applied, the first and second devices being substantially identical MOS transistors, and each load device being a separate MOS load transistor whose gate terminal is connected to its drain terminal and whose source terminal is connected to its substrate terminal, each load transistor being substantially identical to the transistor with which it is connected in series.

7. A circuit for detecting the common mode signal present on first and second input terminals comprising
   (a) a first transistor one of whose high current carrying terminals is connected to the first input terminal;
   (b) a second, identical transistor one of whose high current carrying terminals is connected to the second input terminal;
   (c) electrically connecting means for connecting another high current terminal of each of the first and second transistors to an output terminal;
   (d) first control means, connected to a control terminal of the first transistor, for delivering to the control terminal of the first transistor a first control voltage which is midway between a first reference voltage and the voltage on the first input terminal,
   (e) second control means, connected to a control terminal of the second transistor, for delivering to the control terminal of the second transistor a second control voltage which is midway between the first reference voltage and the voltage on the second input terminal.

8. A circuit according to claim 7, in which the first and second transistors are MOS field effect transistors in which the control terminal of each of the transistors is the gate terminal thereof, further comprising:
   (a) first bias means having an output node connected to the substrate terminal of the first transistor for delivering to the substrate of the first transistor a first bias voltage which is midway between a second reference voltage and the voltage on the first input terminal; and
   (b) second bias means having an output node connected to the substrate terminal of the second transistor for delivering to the substrate of the second transistor a second bias voltage which is midway between the second reference voltage and the voltage on the second input terminal.

9. A circuit according to claim 8 in which the first control means comprises:
first and second matched loads connected in series between a first reference voltage terminal, carrying the first reference voltage, and the first input terminal, whereby the first control voltage is developed at a first node between the first and second loads in response to signal on the first input terminal;
and in which the second control means comprises:
third and fourth matched loads connected in series between the first reference voltage terminal and the second input terminal, whereby the second control voltage is developed at a second node between the third and fourth loads in response to signal on the second input terminal.

10. A circuit according to claim 9, the first bias means comprising:
fifth and sixth matched loads connected in series between a second reference voltage terminal, carrying the second reference voltage, and the first input terminal, whereby the first bias voltage is developed at a node between the fifth and sixth loads in response to signal on the first input terminal;
and the second bias means comprising:
seventh and eighth matched loads connected in series between the second reference voltage terminal and the second input terminal, whereby the second bias voltage is developed at a node between the seventh and eighth loads in response to signal on the second input terminal.

* * * * *

UNITED STATES PATENT AND TRADEMARK OFFICE
CERTIFICATE OF CORRECTION

PATENT NO. : 4,518,870
DATED : May 21, 1985
INVENTOR(S) : Mihai Banu

It is certified that error appears in the above-identified patent and that said Letters Patent is hereby corrected as shown below:

Column 1, line 30, "increased" should read --increases--.
Column 3, line 58, "ED" should read --EB--.

Signed and Sealed this

Twenty-ninth Day of October 1985

[SEAL]

Attest:

DONALD J. QUIGG

Attesting Officer

Commissioner of Patents and
Trademarks—Designate